United States Patent [19]

Zinser et al.

[11] Patent Number: 5,073,940

[45] Date of Patent: Dec. 17, 1991

[54] METHOD FOR PROTECTING MULTI-PULSE CODERS FROM FADING AND RANDOM PATTERN BIT ERRORS

[75] Inventors: Richard L. Zinser, Schenectady; Steven R. Koch, Waterford; Raymond L. Toy, Latham, all of N.Y.

[73] Assignee: General Electric Company, Schenectady, N.Y.

[21] Appl. No.: 441,022

[22] Filed: Nov. 24, 1989

[51] Int. Cl.[5] ............................................. G10L 5/00
[52] U.S. Cl. ........................................ 381/47; 381/38
[58] Field of Search ................................... 381/38, 47

[56] References Cited

U.S. PATENT DOCUMENTS

| 4,688,224 | 8/1987 | Degan | 381/47 |
| 4,710,960 | 12/1987 | Sato | 381/47 |
| 4,747,104 | 5/1988 | Piret | 371/38.1 |

OTHER PUBLICATIONS

B. S. Atal et al., "A New Model of LPC Excitation for Producing Natural-Sounding Speech at Low Bit Rates", Proc. of 1982 IEEE Int. Conf. on Acoustics, Speech and Signal Processing, May, 1982, pp. 614–617.
A. J. Viterbi et al., Principals of Digital Communication and Coding, McGraw Hill, 1979, pp. 301–315.
N. DalDegan et al., "Communications by Vocoder on a Mobile Satellite Fading Channel", Proc. of the IEEE Int. Conf. on Communications-1985 (ICC-85), Jun. 1985, pp. 771–775.
A. S. Tanenbaum, Computer Networks, Prentice Hall, 1981, pp. 128–132.

Primary Examiner—Emanuel S. Kemeny
Attorney, Agent, or Firm—Lawrence P. Zale; James C. Davis, Jr.; Marvin Snyder

[57] ABSTRACT

A low-overhead method of protecting multi-pulse speech coders from the effects of severe random or fading pattern bit errors combines a standard error correcting code (convolutional rate ½ coding and Viterbi trellis decoding) for protection in random errors with cyclic redundancy code (CRC) error detection for fading errors. Compensation for detected fading errors takes place within the speech coder. Protection is applied only to the perceptually significant bits in the transmitted frame.

11 Claims, 6 Drawing Sheets fig. 3

METHOD FOR PROTECTING MULTI-PULSE CODERS FROM FADING AND RANDOM PATTERN BIT ERRORS

CROSS-REFERENCE TO RELATED APPLICATIONS

The invention described herein is related in subject matter to the inventions disclosed in R.L. Zinser copending applications for "Method For Improving The Speech Quality In Multi-Pulse Excited Linear Predictive Coding", Ser. No. 07/353,856 filed May 18, 1989, "Hybrid Switched Multi-Pulse/Stochastic Speech Coding Technique", Ser. No. 07/353,855 filed May 18, 1989, and "Method For Improving Speech Quality In Code Excited Linear Predictive (CELP) Coding", Ser. No. 07/427,074 filed Oct. 26, 1989 now U.S. Pat. No. 4,980,916, all of which are assigned to the assignee of this application. The disclosures of the aforesaid copending applications are incorporated herein by reference.

BACKGROUND OF THE INVENTION

This invention generally relates to digital voice transmission systems and, more particularly, to a low-overhead method for protecting multi-pulse speech coders against the effects of severe random or fading pattern bit errors, common to digital mobile radio channels.

Code Excited Linear Prediction (CELP) and Multi-pulse Linear Predictive Coding (MPLPC) are two of the most promising techniques for low rate speech coding. While CELP holds the most promise for high quality, its computational requirements can be excessive for some systems. MPLPC can be implemented with much less complexity, but it is generally considered to provide lower quality than CELP.

Multi-pulse coding was first described by B.S. Atal and J. R. Remde in "A New Model of LPC Excitation for Producing Natural Sounding Speech at Low Bit Rates", *Proc. of 1982 IEEE Int. Conf. on Acoustics, Speech, and Signal Processing*, May 1982, pp. 614–617. It was described as an improvement on the rather synthetic quality of the speech produced by the standard U.S. Department of Defense (DOD) LPC-10 vocoder. The basic method is to employ the Linear Predictive Coding (LPC) speech synthesis filter of the standard vocoder, but to excite the filter with multiple pulses per pitch period, instead of with the single pulse as in the DOD standard system.

In low-rate speech coding systems, bit errors can introduce appreciable artifacts into the decoded speech. For example, at a bit error rate (BER) of 5%, an unprotected 4800 bit/second multi-pulse speech coder would exhibit poor intelligibility in the output speech. Since a random bit error rate of 5% is not uncommon in digital mobile radio, protection of the coder against random pattern bit error artifacts is very important.

In addition to random pattern errors, mobile radio exhibits a more severe error effect known as fading errors. Fading errors occur when a moving vehicle encounters an area where the direct and reflected signals combine destructively and produce little or no signal level at the receiver. Such fades occur in a quasi-periodic fashion, where the length of and time between fades, depend on the vehicle speed, transmission rate, and carrier frequency. During a fade, all information is lost, and a random stream of bits is sent to the speech decoder. Thus the speech coder operates with occasional bursts of an effective 50% BER. These bursts produce severe short-term "whoop" and "splat" artifacts in the speech output. Conventional error protection schemes (such as convolutional coding) cannot protect against most fades.

Convolutional coding with Viterbi decoding is well known for its superior performance with random bit error patterns. See A. J. Viterbi and J. K. Omura, *Principles of Digital Communication and Coding*, McGraw-Hill, 1979, pages 301–315. Experimental results show that a rate $\frac{1}{2}$ coder (a coder that produces one additional check bit for each input bit, i.e., "1 bit in, 2 bits out") will perform quite well in 5% randomly distributed errors, producing a post-decoder output BER of 0.2–0.4%. Unfortunately, in an 800 MHz, 44 kbit/second fading channel model, it provides no improvement. Thus, a rate $\frac{1}{2}$ convolutional coder/Viterbi decoder is useful for randomly distributed errors only.

If a means for detecting fade occurrence is provided, then some degree of fade protection can be achieved by taking "evasive action" within the speech decoding algorithm. Systems to accomplish such result take advantage of the quasi-stationary and periodic nature of the speech signal by interpolating or holding over spectral and gain information from a previous usable or "good" frame. Such system is described by N. DalDegan, F. Perosino and F. Rusina in "Communications by Vocoder on a Mobile Satellite Fading Channel", *Proceedings of the IEEE International Conference on Communications* — 1985. (ICC-85), pp. 771–775, June 1985, for a standard LPC-10 vocoder.

The DalDegan et al. method detects fades using what they characterize as a "Signal Quality Detector" and by estimating the LPC distance between contiguous frames. Presumably, if the quality detector indicates an unusable, or "bad" frame, and the LPC distance measure between the "bad" frame and the previous "good" frame is above a threshold, the algorithm will reuse the previous frame's LPC coefficients; or, if a faded frame occurs between two good frames, it will interpolate the LPC values from the surrounding frames for the bad frame. While the DalDegan et al. algorithm also interpolates (or holds over) values for the pitch period and the gain, it cannot provide any protection during periods of random pattern errors. It requires a signal level measurement to indicate the presence of a deep fade.

What is needed is a scheme that protects against the effects of both random and fading pattern errors while using as little overhead (i.e., extra bits transmitted for error correction or detection) as possible.

SUMMARY OF THE INVENTION

One object of the present invention is to provide a low-overhead method for protecting multi-pulse speech coders from the effects of severe random or fading pattern bit errors.

Another object is to select bits to be protected in multi-pulse speech coding that will result in the best performance while minimizing the hardware and software required to support the protection scheme.

Briefly, in accordance with a preferred embodiment of the invention, a method is provided to combine a standard error correcting code (i.e., convolutional rate $\frac{1}{2}$ coding and Viterbi trellis decoding) for protection against the effects of random errors with cyclic redundancy code (CRC) error detection for protection against the effects of fading errors. Compensation for detected fading errors takes place within the speech coder. Protection is applied only to the bits in the transmitted frame that are perceived to be significant, or "perceptually significant" bits.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIG. 3 is a table showing the protected and unprotected bits that are transmitted, per frame, to the multi-pulse receiver in the protection system of the invention;

DETAILED DESCRIPTION

The Prior Art

Figure 1:
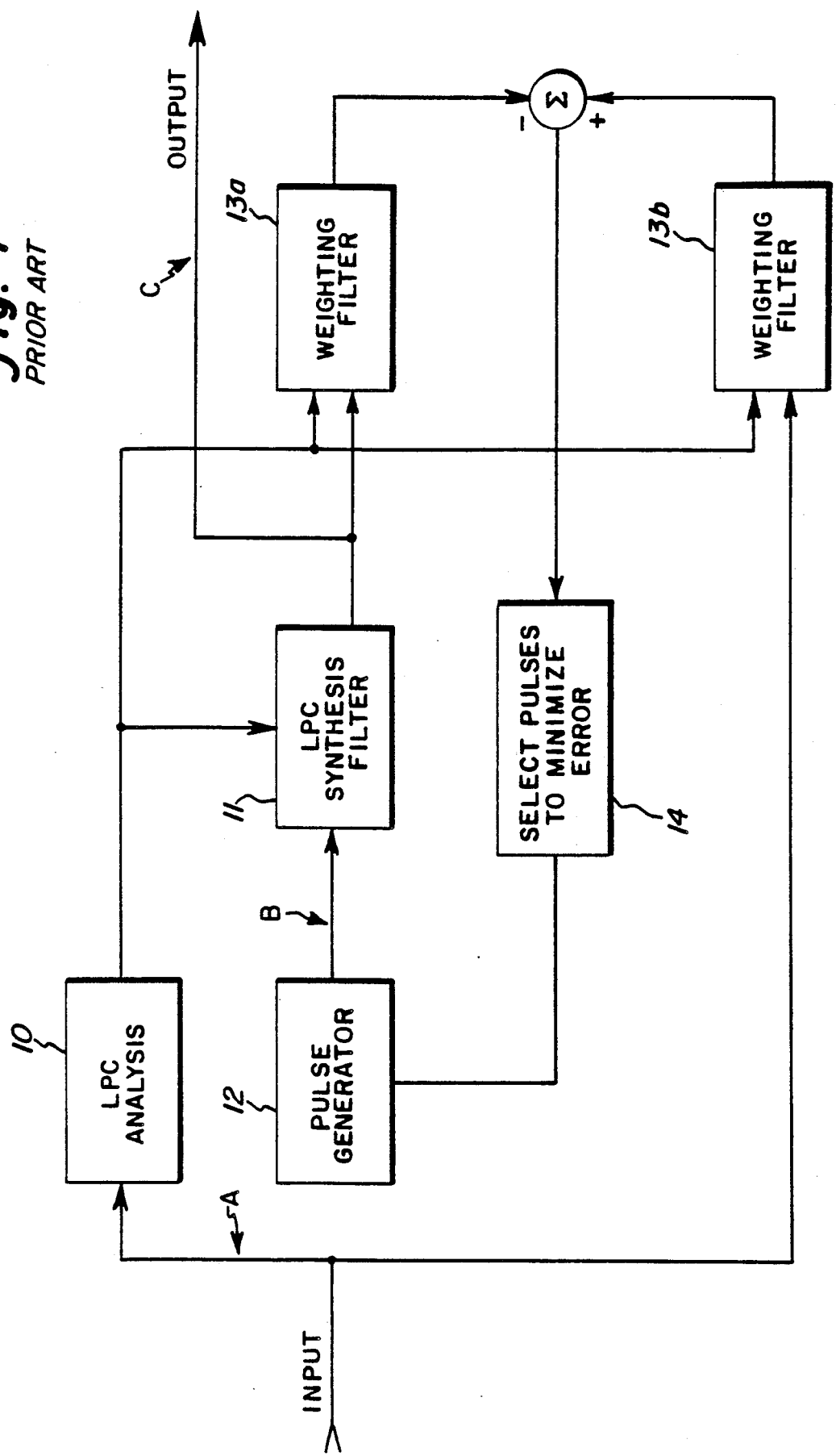
FIG. 1 is a block diagram showing the implementation of the basic multi-pulse speech coding technique.
Figure 2:
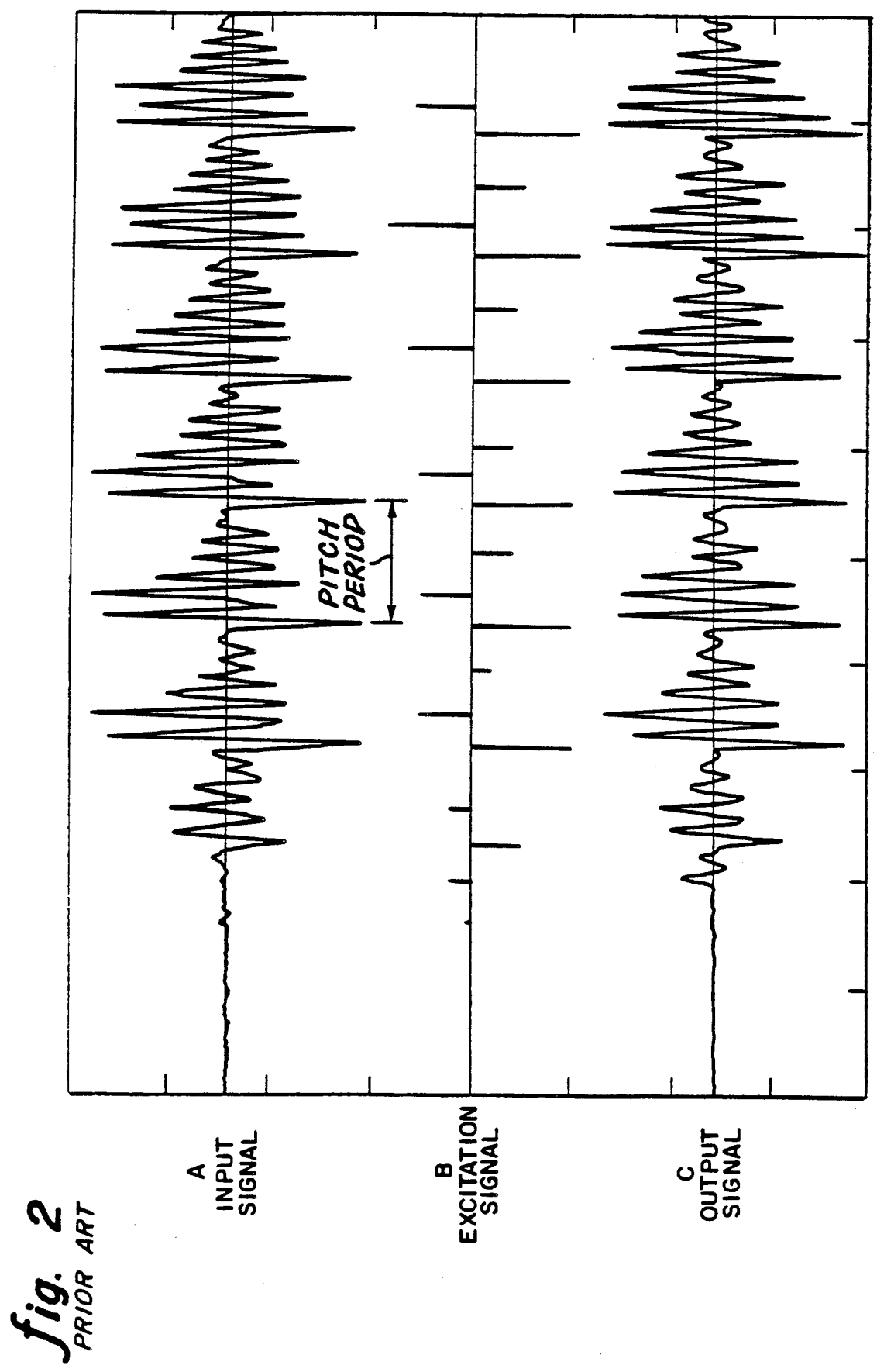
FIG. 2 is a graph showing respectively the input, the excitation and the output signals in the system shown in FIG. 1.

In employing the basic multi-pulse technique using the conventional system shown in FIG. 1, the input signal at A (shown in FIG. 2) is first analyzed in a linear predictive coding (LPC) analysis circuit 10 to produce a set of linear prediction filter coefficients. These coefficients, when used in an all-pole LPC synthesis filter 11, produce a filter transfer function that closely resembles the gross spectral shape of the input signal. A feedback loop formed by a pulse generator 12, synthesis filter 11, weighting filters 13a and 13b, and an error minimizer 14, generates a pulsed excitation at point B that, when fed into filter 11, produces an output waveform at point C that closely resembles the input waveform at point A. This is accomplished by selecting pulse positions and amplitudes to minimize the perceptually weighted difference between the candidate output sequence and the input sequence. Trace B in FIG. 2 depicts the pulse excitation for filter 11, and trace C shows the output signal of the system. The resemblance of signals at input A and output C should be noted. Perceptual weighting is provided by weighting filters 13a and 13b. The transfer function of these filters is derived from the LPC filter coefficients. A more complete understanding of the basic multi-pulse technique may be gained from the aforementioned Atal et al. paper.

THE PREFERRED EMBODIMENT OF THE INVENTION

The particular coder intended to be employed in the preferred embodiment of the invention is of the general type described in copending patent applications Ser. No. 07/353,856 and Ser. No. 07/353,855. Table 1 provides the specifications for the coder.

TABLE 1

| Bit Allocation for Multipulse Coder | | | | |
|---|---|---|---|---|
| LPC/LSPF data | Center 1 | 4 bits | Difference 1 | 4 bits |
| | Center 2 | 4 bits | Difference 2 | 4 bits |
| | Center 3 | 4 bits | Difference 3 | 4 bits |
| | Center 4 | 3 bits | Difference 4 | 2 bits |
| | Center 5 | 3 bits | Difference 5 | 0 bits |
| Pitch Lag | | 7 bits | | |

| Subframe Data (4 sets transmitted per frame) | | |
|---|---|---|
| Data | bits/subframe | total bits/frame |
| Voiced/Unvoiced Decision | 1 bit | 4 bits |
| Subframe Pitch Tap Gain ($\beta$) | 5 bits | 20 bits |
| Amplitude 1 | 6 bits | 24 bits |
| Position 1 | 6 bits | 24 bits |
| Amplitude 2 | 6 bits | 24 bits |
| Position 2 | 6 bits | 24 bits |

The transmitted data are divided into two groups: spectral and pitch lag data which are sent once per frame, and excitation and pitch tap data which are sent four times per frame. Each subset of excitation data represents one N/4 sample subframe of speech. For low-rate coders, N is frequently 256, so the subframe size is usually 64 samples.

The spectral information is comprised of 10 LPC coefficients. For transmission, the set of coefficients is first translated into 10 line spectrum pair frequencies (LSPF). Each pair of line spectrum frequencies is scalar quantized as a discrete center and a difference frequency. The total bit allocation for LPC coefficient transmission is 32 bits. The bit allocation for each LSPF is given in Table 1, above. (It will be noted that LSPF difference frequency 5 is not transmitted — instead, a long term average is employed.)

The pitch lag is an integer number between 32 and 120. For transmission, the 7-bit binary equivalent is sent.

The subframe information is comprised of the data for two pulses (2 discrete locations and amplitudes), 1 bit for voiced/unvoiced (V/UV) decision, and the subframe pitch tap gain, $\beta$. Pulse positions are integer numbers generally between 0 and 63 and are sent as their 6-bit binary equivalents. Pulse amplitudes are nonuniformly quantized using a Max algorithm data-derived scalar quantizer; each pulse amplitude is allotted 6 bits. The pitch tap gain $\beta$ is also quantized with a Max quantizer using 5 bits. The total number of bits for each subframe is 30; thus 120 bits per frame are used for excitation and pitch tap gain ($\beta$) information. If the pitch lag and LPC data (i.e., line spectrum pair frequencies) are included, a total of 159 bits per frame are sent.

For a predictive speech coder, such as a multi-pulse coder, the effect of bit errors on the output speech quality depends on: 1) the coefficient that is perturbed by the error, and 2) the significance of the individual bit perturbed within that coefficient. For example, one might expect that a bit error in the most significant bit of a pulse amplitude creates more havoc in the output than an error in the least significant bit of a pulse position. This is indeed true. The problem is to determine which group of bits require the most protection.

The optimal group of bits to protect can be determined by first deriving or measuring the perturbation (or SNR loss) of the output signal as a multivariate function of the probability of bit error in the N bits in the frame. The maxima of this function can be analyzed for the purpose of determining which bits to protect and how much protection to apply. For a simple speech coding technique, this function can be derived either analytically or by numerical methods; e.g., a system employing an 8-bit μ-law PCM (as per the CCITT standard digital telephone transmission format) would produce a function of eight variables. However for a complex system such as the multi-pulse coder described above, there are 159 bits in a frame, each of which produces a unique effect in the output signal when an error is made in that particular bit. This would require producing a sensitivity function of 159 variables by numerical methods, which is currently beyond available computing resources.

For the reasons stated above, a sub-optimal technique must be employed to choose the bits to be protected. For the present invention, a two-stage technique has been employed. In the first stage, a computer simulation was run comprising 159 independent speech coder runs, with each run having a 50% chance of a bit error for a particular bit within a frame. For example, for run #1, an error could only be made in the first bit (the most significant bit) of LSP (line spectrum pair) center frequency #1, with all other bits left unchanged. For run #2, errors were made only in the second bit of a frame. The process was continued for all 159 bits in a transmitted frame. Comparing the measured output signal-to-noise ratio (SNR) for each run to that for a run with no errors provided an indication of how much an error in a specific bit within a frame perturbs the output signal. The run numbers with the largest drop in SNR (compared to the no error run) indicate which bits are the most sensitive.

One drawback in using the method described above is that the effects of multiple bit errors within a frame are not taken into account. Errors in several different bits could combine to produce a much larger artifact than a single error. With a 5% random bit error rate, an average of eight bit errors occur during each frame, thereby nearly assuring presence of multiple bit errors in each frame at the design limit of the system.

During initial testing, an occurrence of the aforementioned problem was observed. A protection scheme was then implemented that covered eighty of the most significant bits, as determined by the computer simulation described above. The results at 5% random BER, while good, were disappointing because many spectral artifacts remained. Examining the list of protected and unprotected bits, it was noted that only about half of the LSP/LPC spectral coefficients were protected. Since the LSP/LPC data are especially prone to large amplitude artifacts when two or more frequency pairs are disturbed, this effect was not unexpected.

Figure 3:
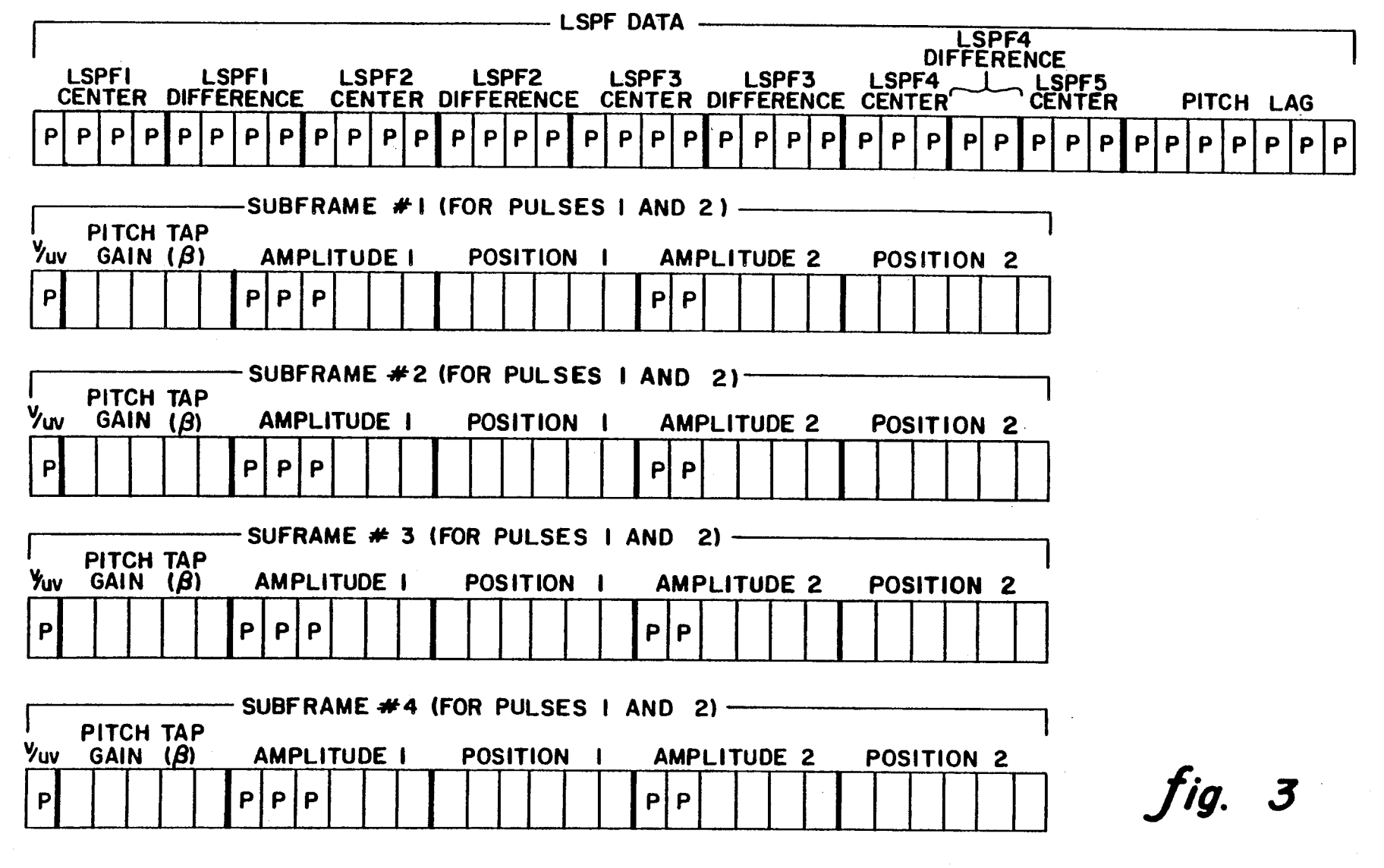

The second stage of the bit selection technique was to hand-tune the selection based on the simulation results and personal expertise. The final selection of protected bits is given in FIG. 3, which shows the transmitter bit stream for the multi-pulse coder, wherein LSP data is sent first, followed by pitch lag data, then followed by the data for the subframes. Bits marked "P" are protected bits. All of the LSP/LPC data are now protected, eliminating the previously observed short-term spectral artifacts. In addition, the pitch lag is completely protected. Subframe data that are protected comprise the voiced/unvoiced decision bits, the three most significant bits for Amplitude 1, and the two most significant bits for Amplitude 2. A total of sixty-three speech data bits are protected.

A convolutional code was used to protect the sixty-three selected bits from random pattern bit errors. Different codes of rate ½ and ⅔ were tested. The rate ⅔ codes were generally unable to correct 5% random bit errors. However, the rate ½ codes fared better, as expected. After some experimentation, the following two rate ½ convolutional codes (Table 2) were chosen. The first is more complex but gives better protection, whereas the second is simpler and performs only slightly worse. In each case, the optimal Viterbi decoder with hard decisions was used.

TABLE 2

| Generators for Rate 1/2 Coders | | |
|---|---|---|
| Constraint Length (bits) | Polynomial #1 | Polynomial #2 |
| 6 | 100000 | 110101 |
| 3 | 101 | 111 |

Experiments showed that performance of both codes were comparable, but at high bit error rates (5% or more), the short code performed slightly better, with reduced complexity. This is believed due to the decreased memory in the code so that decoding errors do not propagate as long.

While the convolutional coder/Viterbi decoder can protect the selected bits adequately in a 5% random BER environment, it will not protect against fades. To detect the fades, we merely detect the occurrence of a fade and pass this information along to the multi-pulse speech decoder. For purposes of this invention, a "fade" is considered to have occurred whenever the convolutional coder/Viterbi decoder fails to correct all of the errors in the protected bits. (This condition also occurs under very heavy random errors, and any uncorrected errors will have a degenerative effect on the speech decoder.) To detect the uncorrectable errors, cyclic redundancy code (CRC) checksums are added to the protected speech coder bits before convolutional encoding; in this manner, therefore, both the checksum bits and the critical speech coder bits are protected by the convolutional code. This configuration minimizes the probability of false fade detection. In the receiver, the checksum bits and critical speech bits are recovered by the Viterbi decoder, and then these bits are checksummed. A non-zero checksum output signal indicates presence of uncorrected errors in the output signal of the Viterbi decoder. For details on CRC checksum operation and implementation, see A. S. Tanenbaum, *Computer Networks*, Prentice-Hall (1981), pp. 128-132.

Under certain conditions, it is possible for a fade to be of such short duration that it destroys only a small segment of a transmitted frame. For this reason, the invention involves dividing the critical speech coder bits into three segments and employing a separate checksum of each segment. The segments are chosen such that the bits within a single segment contain localized information pertaining to a related group of coefficients. Thus an error in one segment of a frame can cause only a localized time or frequency disturbance in the output speech waveform. The first checksum checks the 32-bit LPC/LSPF data and 7-bit pitch data. The second sum checks the voiced/unvoiced (V/UV) decision bit and amplitude data for the first two subframes, and the third sum checks the same data for the second two subframes. The properties of the three checksums employed are given in Table 3 below.

TABLE 3

| CRC Polynomials for Fade Detection | | |
|---|---|---|
| CRC # | length (bits) | polynomial |
| 1 | 6 | $x^6 + x^2 + x^1 + 1$ |
| 2 | 5 | $x^5 + x^4 + x^2 + 1$ |
| 3 | 5 | $x^5 + x^4 + x^2 + 1$ |

Each of these sums is capable of detecting any single error and any odd number of errors. The CRC of length five detects all double errors up to a message of length seven, all single burst errors with message lengths less than fifteen, 93.8% of the bursts of length six, and 96.9% of the bursts of length greater than six. Similarly, the length six CRC detects all double errors up to a message length of thirty-one, all burst errors of length less than six, 96.9% of the bursts of length seven, and 98.4% of the bursts of length greater than seven. Therefore, the chance of a missed detection is fairly small.

To minimize the perceptual effect of uncorrected fades on the output speech, we have devised an algorithm that changes the synthesis parameters/coefficients of the speech decoder according to the checksum reporting the error. The parameters/coefficients that are changed depend on the checksum(s) that report an error. The actions taken for detected errors are listed below, organized by checksum segment.

Checksum 1: LPC/LSP and Pitch Lag

For the entire frame:
1. Use the entire set of LPC coefficients from the most recent error-free set received. Continue using this set of coefficients until a new error-free set is received.
2. Perform the same action as in #1 for the pitch lag.

Checksum 2: Excitation Data, Subframes 1 and 2

During subframes 1 and 2:
1. Use the most recent error-free bit for the voiced/unvoiced decision.
2. Zero all pulse amplitudes.
3. Set the pitch tap gain to 0.85.

Checksum 3: Excitation Data, Subframes 3 and 4

During subframes 3 and 4:
1. Use the most recent error-free bit for the voiced/unvoiced decision.
2. Zero all pulse amplitudes.
3. Set the pitch tap gain to 0.85.

The behavior of this algorithm can be explained as follows. If uncorrected errors appear in the LPC/LSP spectral data or pitch, the previous values are used to ensure continuity of the overall spectral shape (i.e., the particular vowel sound) and the pitch period during a fade. This continuity serves to mask many errors that may occur in the excitation. For this reason, the excitation data is not as heavily protected (only twenty out of 120 bits) as the spectral and pitch data. In addition, separate, less powerful checksums are used for the excitation.

If an uncorrected error occurs in one of the excitation data blocks, the algorithm immediately zeros out any new excitation that would have been decoded, and uses only previously stored "clean" excitation contained in the pitch buffer. This action also prevents any artifacts from getting into the long term pitch buffer, where they would propagate until a silent period is encountered. Furthermore, the pitch predictor tap is set at a stable value of 0.85, which will provide continuity of sound over several frames, but ultimately decay the output sound to zero, should the fade last for a half-second or more. This is a valuable feature, since few would want to listen to a sustained vowel tone while stopped at a traffic light, e.g., "How are yooooooooo . . .", for the duration of the stop.

An additional benefit of multiple checksums within a frame arises if a very high random error rate is encountered, since it is possible that checksum errors will be detected during every frame. If only one checksum were used to trigger all of the above actions, the result would be very little output signal from the speech decoder. Having multiple (i.e., three) checksums decreases the probability that all three will fail during a given frame, and some excitation will therefore make it through to the output LPC filter stage. Thus this vocoder "evasive action" not only provides improved performance during fades, but also helps during periods of heavy random errors. This is a principal difference between the new algorithm described herein and the conventional system described by DalDegan et al., supra.

Figure 4:
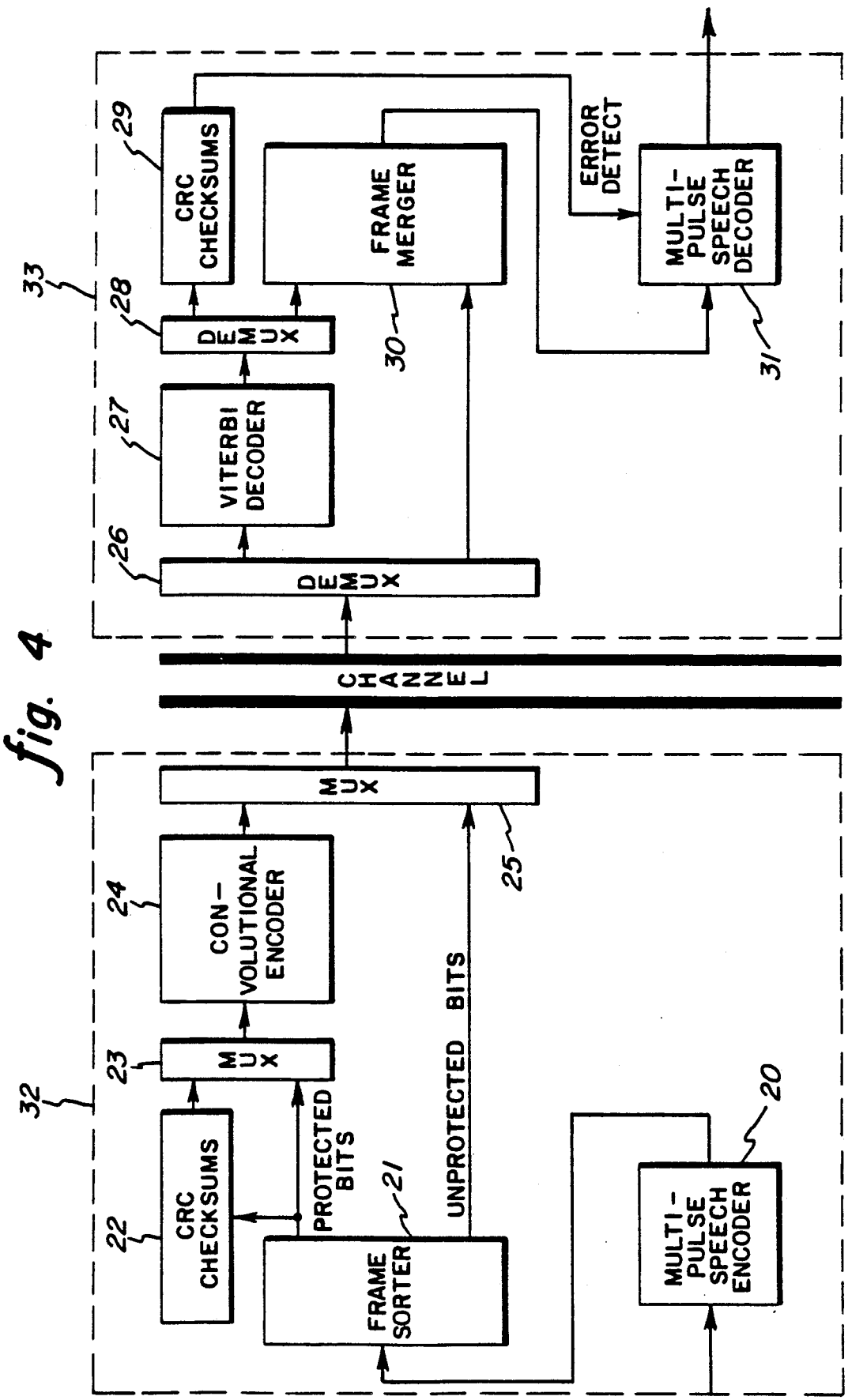
FIG. 4 is a block diagram of the basic protection system according to the present invention.

The new algorithm is implemented in the system shown in FIG. 4. In a transmitter portion 32, a multi-pulse speech coder 20 of the type generally described in copending application Ser. No. 07/353,855 and Ser. No. 07/353,855 provides a coded output signal to a frame sorter 21. The frame sorter separates the bits of a coded frame into two categories, protected and unprotected bits, these categories having been determined according to the procedures described above. Checksums are calculated for the protected bits by checksum generator 22. These sums are merged with the protected bits by multiplexer 23 and supplied to a convolutional encoder 24. The output signal of the convolutional encoder and the unprotected bits from frame sorter 21 are assembled in a multiplexer 25 to form a frame which is transmitted to a receiver 33.

At the receiver, the bits are first separated into encoded and non-encoded segments by a demultiplexer 26. The encoded bits are supplied to a Viterbi decoder 27 which provides output signals to a CRC checksum generator 29 and a frame merger 30 through demultiplexer 28. Frame merger 30 reconstructs the multi-pulse encoded speech bits and supplies these data to a multi-pulse speech decoder 31. Errors detected by CRC checksum generator 29 are coupled to multi-pulse speech decoder 31 which performs the actions taken for the detected errors as previously enumerated for checksum segments 1, 2 and 3.

Figure 5:
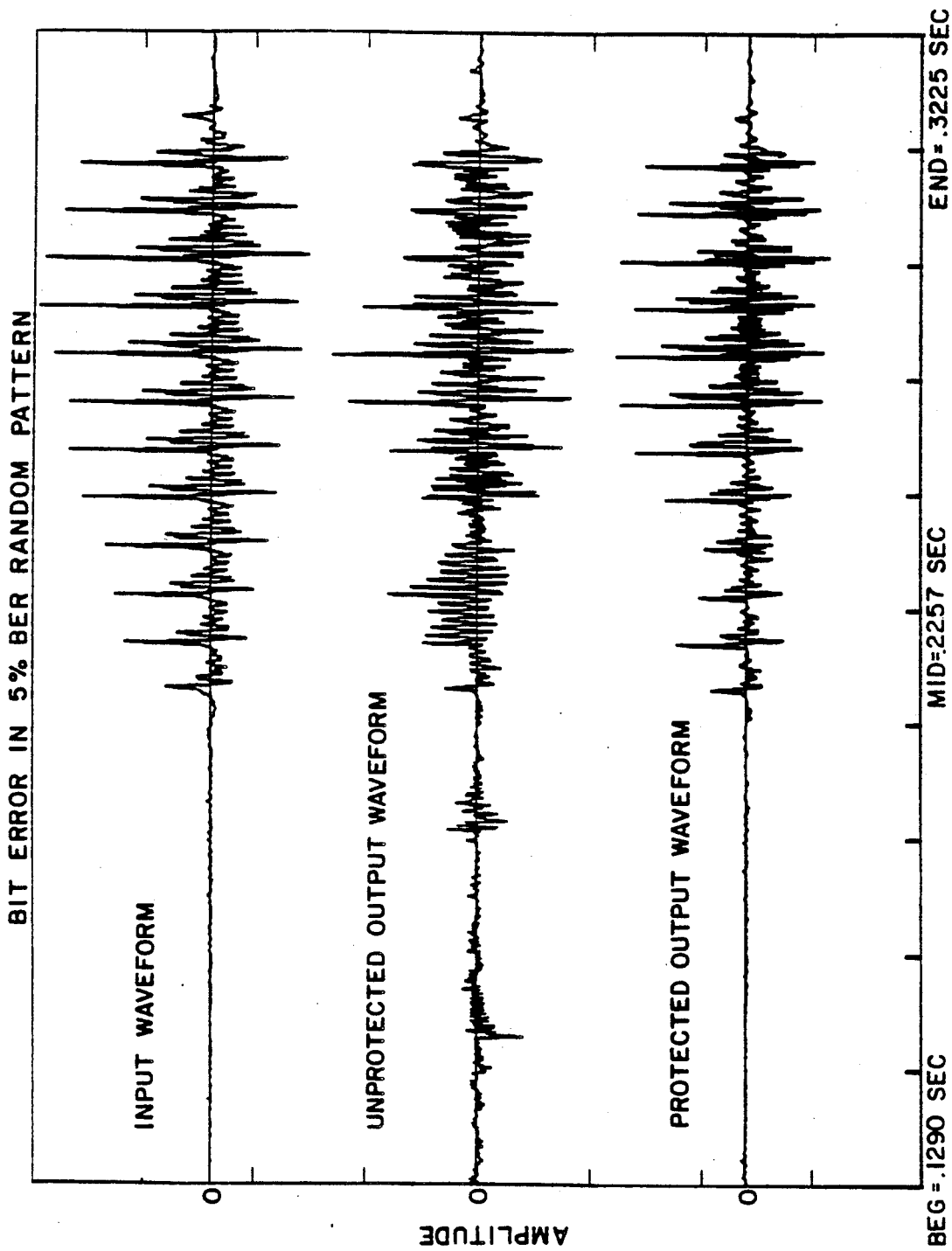
FIG. 5 is a graph showing, respectively, the input signal waveform, the unprotected output signal waveform and the protected output signal waveform of the system shown in FIG. 4 for bit error effects in a 5% BER random pattern.
Figure 6:
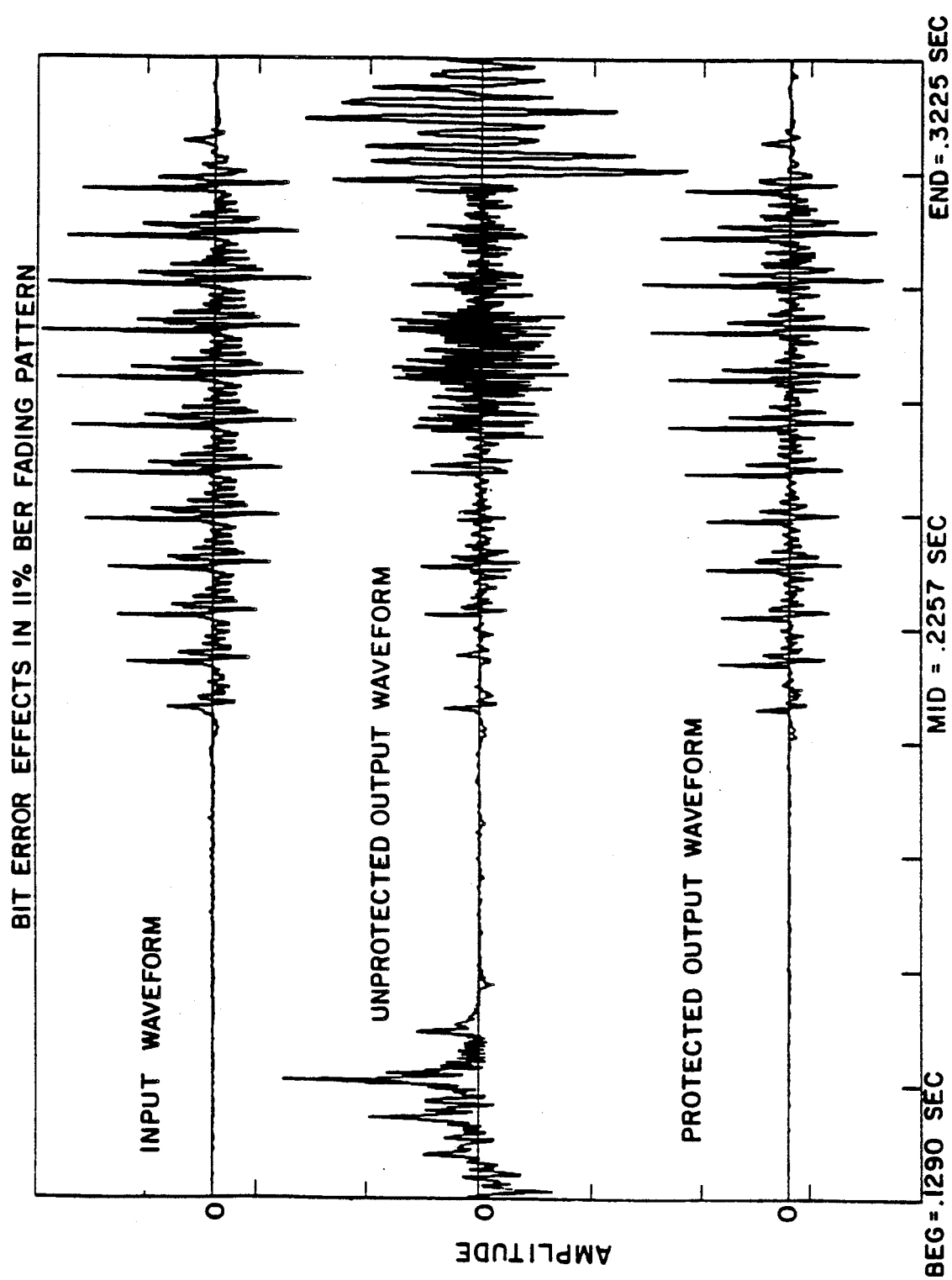
FIG. 6 is a graph showing respectively the input signal waveform, the unprotected output signal waveform and the protected output signal waveform of the system shown in FIG. 4 for bit error effects in an 11% BER random pattern.

Although the best method for evaluation of the results is through a listening test, a valid demonstration of performance can be obtained by examining the time-domain waveforms of output speech. FIG. 5 shows the system results for the phoneme /ha/ in a 5% BER random environment. It is clear that the protected output waveform resembles the input waveform more closely than that of the unprotected output waveform. FIG. 6 shows the same results for an 11% BER fading environment.

Performance of the protection scheme may also be measured by measuring the signal-to-noise ratio (SNR) for unprotected and protected coders operating in the same environment. Table 4 gives the results for 5% random and 11% fading environments. These measurements were taken for a segment of male speech, "Happy hour is over."

TABLE 4

| SNR (dB) for Unprotected and Protected Coders | | | |
|---|---|---|---|
| Random 5% BER | | Fading 11% BER | |
| Unprotected | Protected | Unprotected | Protected |
| −9.03 | +1.41 | −7.15 | +3.35 |
| Improvement | | Improvement | |
| +10.44 | | +10.5 | |

While analyzing Table 4, it should be kept in mind that absolute SNR values are not measures of quality of the output speech. The important number is the difference between the protected and unprotected SNR. The table clearly shows over a 10 dB improvement in both random and fading pattern errors.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for protecting multi-pulse linear predictive speech coders from fading and random pattern bit errors comprising the steps of:
   selecting perceptually significant bits of multi-pulse coded speech parameters to be protected, the parameters being a set of line spectrum pair frequency coefficient bits, pitch lag bits, voiced/unvoiced bits, pitch tap gain bits, pulse amplitude bits, and pulse position bits;
   generating checksums of said selected bits;
   combining said checksums and said selected bits;
   coding the selected bits and said checksums according to a convolutional code to protect transmitted data from random errors;
   combining the convolutionally coded selected bits, checksums, and nonselected bits of the multi-pulse encoded speech; and
   transmitting the combined convolutionally coded selected bits, checksums, and nonselected bits.

2. The method recited in claim 1 further comprising the steps of:
   receiving said combined convolutionally coded selected bits, checksums, and nonselected bits;
   separating the combined convolutionally coded selected bits, checksums, and nonselected bits;
   decoding said convolutionally coded selected bits;
   merging said decoded selected bits with said nonselected bits to form a multi-pulse encoded speech bit stream; and
   decoding said multi-pulse speech bit stream.

3. The method recited in claim 2 further comprising, prior to the step of coding the selected bits, the steps of:
   generating checksums of said selected bits; and
   combining said checksums and said selected
   said method further comprising, prior to the step of merging said decoded selected bits with said nonselected bits, the steps of:
   separating the decoded checksums and the decoded selected bits;
   checking for errors based on said checksums; and
   producing an indication of a detected error.

4. The method recited in claim 3 further comprising, when an error is detected in linear predictive coding/- line spectrum pair frequencies or in pitch lag, the step of using all linear predictive coding coefficients contained in the most recent error-free received set of multi-pulse speech bits until a new error-free set of multi-pulse speech bits is received.

5. The method recited in claim 3 further comprising, when an error is detected in excitation data during the first two subframes of any frame, each subframe including a voiced/unvoiced bit, pitch tap gain bits, and amplitude and position bits for a plurality of pulses, the steps of:
   using the most recently received error-free voiced/unvoiced bit for making a voiced/unvoiced decision;
   zeroing all pulse amplitudes for which an error has been detected; and
   setting a pitch tap gain for the multi-pulse speech bit stream to a predetermined value less than one.

6. The method recited in claim 3 further comprising, when an error is detected in excitation data during the last two subframes of any frame, each subframe including a voiced/unvoiced bit, pitch tap gain bits, and amplitude and position bits for a plurality of pulses, the steps of:
   using the most recently received error-free voiced/unvoiced bit for making a voiced/unvoiced decision;
   zeroing all pulse amplitudes for which an error has been detected; and
   setting a pitch tap gain for the multi-pulse speech bit stream to a predetermined value less than one.

7. A multi-pulse speech coder/decoder system which minimizes the effects of fading and random pattern bit errors, said system comprising transmitter means including:
   frame sorter means for selecting perceptually significant bits of multi-pulse encoded speech to be protected;
   a convolutional encoder coupled to said frame sorter means for coding the selected bits to protect transmitted data from random errors; and
   a multiplexer coupled to said frame sorter and said convolutional encoder for combining the convolutionally coded selected bits and nonselected bits of the multi-pulse encoded speech for transmission to receiver means.

8. The multi-pulse speech coder/decoder system recited in claim 7 wherein said transmitter means further includes:
   a checksum generator coupled to said frame sorter means for generating checksums of said selected bits; and
   a second multiplexer coupled to said frame sorter means and said checksum generator for combining said checksums and said selected bits and for supplying said combined checksums and said selected bits to said convolutional encoder.

9. The multi-pulse speech coder/decoder system recited in claim 7 and further comprising receiving means for receiving said combined convolutionally coded selected bits and nonselected bits, said receiving mans including:
   a demultiplexer for separating the combined convolutionally coded selected bits and nonselected bits;
   a decoder coupled to said demultiplexer for decoding said convolutionally coded selected bits;
   frame merger means for merging said decoded selected bits with said nonselected bits to form a multi-pulse encoded speech bit stream; and
   multi-pulse speech decoder means for decoding said multi-pulse speech bit steam, and for retaining the last received error-free multi-pulse encoded speech parameters and replacing a received signal with the multi-pulse encoded speech parameters upon receipt of a fading signal.

10. The multi-pulse speech coder/decoder system recited in claim 9 wherein said receiving means further includes:

a second demultiplexer coupled to said decoder for separating the decoded checksums and the decoded selected bits; and a checksum generator coupled to said second demultiplexer for checking for errors based on said checksums and for supplying an indication of a detected error to said multi-pulse speech decoder means.

11. The multi-pulse speech coder/decoder system recited in claim 10 wherein said decoder comprises a Viterbi decoder.

* * * * *